(12) United States Patent
Yin et al.

(10) Patent No.: US 11,891,721 B2
(45) Date of Patent: Feb. 6, 2024

(54) SPOOL-BALANCED SEED LIFT

(71) Applicant: Linton Kayex Technology Co., Ltd, Wuxi (CN)

(72) Inventors: Jiaqi Yin, Dalian (CN); John A. Reese, Rochester, NY (US); Joel C. Stefl, Rochester, NY (US)

(73) Assignee: Linton Kayex Technology Co., Ltd, Wuxi (CN)

( * ) Notice: Subject to any disclaimer, the term of this patent is extended or adjusted under 35 U.S.C. 154(b) by 311 days.

(21) Appl. No.: 17/338,152

(22) Filed: Jun. 3, 2021

(65) Prior Publication Data

US 2022/0195623 A1    Jun. 23, 2022

(30) Foreign Application Priority Data

Dec. 9, 2020 (CN) .......................... 202011449838.0
Dec. 9, 2020 (CN) .......................... 202022979953.0

(51) Int. Cl.
| | | |
|---|---|---|
| C30B 35/00 | (2006.01) | |
| C30B 15/32 | (2006.01) | |
| C30B 15/14 | (2006.01) | |
| C30B 15/24 | (2006.01) | |
| C30B 15/10 | (2006.01) | |
| C30B 15/30 | (2006.01) | |

(52) U.S. Cl.
CPC ............ C30B 35/002 (2013.01); C30B 15/10 (2013.01); C30B 15/14 (2013.01); C30B 15/24 (2013.01); C30B 15/30 (2013.01); C30B 15/32 (2013.01)

(58) Field of Classification Search
CPC ....... C30B 15/30; C30B 15/00; C30B 35/005; Y10T 117/1032; Y10S 117/911; B21B 39/14
See application file for complete search history.

(56) References Cited

U.S. PATENT DOCUMENTS

| | | |
|---|---|---|
| 3,488,036 A | 1/1970 | Feger |
| 4,367,199 A | 4/1983 | Jericho |
| 4,394,352 A | 7/1983 | Helda |

(Continued)

FOREIGN PATENT DOCUMENTS

| | | |
|---|---|---|
| CN | 109440186 A | 3/2019 |
| DE | 1961328 A1 | 4/1979 |

(Continued)

OTHER PUBLICATIONS

J. Evers et al., "Czochralski's Creative Mistake: A Milestone on the Way to the Gigabit Era", 2003 Wiley-VCH Verlag GmbH & Co. KGaA, Weinheim; Angew. Chem. Int. Ed. 42, 5684-5698; www.anewandte.org, (15 pages).

*Primary Examiner* — Matthew J Song
(74) *Attorney, Agent, or Firm* — Nixon Peabody LLP

(57) ABSTRACT

A crystal growing system can include a spool-balanced seed lift assembly for rotating and lifting a seed crystal supported by a cable. The seed crystal is supported along and rotated about a lift axis. The spool-balanced seed lift assembly includes a spool that rotates on, and has a center of gravity along, an axis that intersects the lift axis. As the spool rotates, it moves axially along its axis to avoid displacing the cable from the lift axis. A guide pulley positioned below the spool is used to direct the cable between the lift axis and a spool-tangent axis to minimize displacement of the cable as it is raised and rotated.

16 Claims, 8 Drawing Sheets

(56) References Cited

U.S. PATENT DOCUMENTS

| | | | |
|---|---|---|---|
| 4,663,128 A | | 5/1987 | Helgeland |
| 4,916,955 A | | 4/1990 | Katusoka |
| 5,106,593 A | * | 4/1992 | Mizuishi ............... C30B 15/30 |
| | | | 117/917 |
| 5,322,670 A | | 6/1994 | Ibrahim |
| 5,582,642 A | | 10/1996 | Korb |
| 5,702,523 A | | 12/1997 | Schulmann |
| 5,766,348 A | | 6/1998 | Schulmann |
| 5,879,451 A | | 3/1999 | Mizuishi |
| 5,935,328 A | | 8/1999 | Cherko |
| 6,033,472 A | | 3/2000 | Shiraishi |
| 6,068,699 A | * | 5/2000 | Tsuji ..................... C30B 15/28 |
| | | | 117/201 |
| 6,217,648 B1 | | 4/2001 | Shiraishi |
| 2008/0000415 A1 | | 1/2008 | Muhe |
| 2010/0064965 A1 | | 3/2010 | Muehe |
| 2022/0090292 A1 | | 3/2022 | Powers |

FOREIGN PATENT DOCUMENTS

| | | |
|---|---|---|
| DE | 4329283 C2 | 2/1997 |
| DE | 10007265 B4 | 8/2001 |
| DE | 102004011901 A1 | 12/2005 |
| DE | 102009024472 A1 | 12/2010 |

\* cited by examiner

SPOOL-BALANCED SEED LIFT

CROSS REFERENCE TO RELATED APPLICATIONS

The present application claims the benefit of Chinese Patent Application No. 202011449838.0 filed Dec. 9, 2020 and entitled "Unbiased load seed crystal lifting device," and Chinese Utility Model Application No. 202022979953.0 filed Dec. 9, 2020 and entitled "Unbiased load seed crystal lifting device," both of which are hereby incorporated by reference in their entirety.

TECHNICAL FIELD

The present disclosure relates to crystal growth equipment generally and more specifically to the lifting and rotation of seed crystals.

BACKGROUND

Large crystals, especially monocrystalline ingots, are extremely important to various fields of technology. With respect to modern electronics, monocrystalline silicon is an especially important source material used for various functions, such as wafers for integrated circuits and components of photovoltaic panels. A monocrystalline structure includes a continuous crystal lattice without grain boundaries, and can be made of a single element or of multiple elements (e.g., doped materials).

One manufacturing technique often used to create monocrystalline silicon is the Czochralski method, which involves dipping a seed crystal into a molten bath of material, then slowly pulling the seed crystal away from the molten bath while rotating the seed crystal. However, current techniques suffer from inefficiencies caused by vibration, imbalance, and other similar problems. If not performed correctly, a failure can occur and the resultant ingot may be a polycrystalline ingot, which can include grain boundaries. Since grain boundaries can be problematic for various uses, the failed ingot may have to be melted and re-grown, wasting time and energy. Since monocrystalline growth procedures often take long periods of time (e.g., on the order of tens of hours or days), any failures can have significant consequences to production efficiency.

There is a need for improved equipment for efficiently manufacturing large single crystals, such as monocrystalline silicon.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a seed lift assembly for a crystal growing system. The seed lift assembly comprises a support structure rotatable about a lift axis. The seed lift assembly further comprises a spool for receiving a cable. The cable supports a seed crystal along the lift axis. The spool is rotatable about a spool axis. The spool has a spool center of mass positioned along the spool axis. The spool is coupled to the support structure such that the spool axis intersects the lift axis. The seed lift assembly further comprises a spool driver coupled to the spool to effect rotation of the spool about the spool axis. Rotation of the spool about the spool axis controls winding of the cable about the spool to control vertical displacement of the seed crystal along the lift axis. The seed lift assembly further comprises a guide pulley coupled to the support structure to change an axial direction of the cable between a first direction and a second direction. The first direction is collinear with the lift axis. The second direction is non-collinear with and non-parallel to the lift axis.

Embodiments of the present disclosure include a crystal growing system comprising a furnace tank having a crucible for containing a melt. The crystal growing system further comprises a receiving chamber coupled to the furnace tank. The crystal growing system further comprises a seed crystal suspended within the receiving chamber by a cable along a lift axis. The crystal growing system further comprises a seed lift assembly that is rotatably coupled to the receiving chamber to rotate about the lift axis. The seed lift assembly includes a support structure. The seed lift assembly further includes a spool for receiving the cable. The spool is rotatable about a spool axis. The spool has a spool center of mass positioned along the spool axis. The spool is coupled to the support structure such that the spool axis intersects the lift axis. The seed lift assembly further includes a spool driver coupled to the spool to effect rotation of the spool about the spool axis. Rotation of the spool about the spool axis controls winding of the cable about the spool to control vertical displacement of the seed crystal along the lift axis. The seed lift assembly further includes a guide pulley coupled to the support structure to change an axial direction of the cable between a first direction and a second direction. The first direction is collinear with the lift axis. The second direction is non-collinear with and non-parallel to the lift axis.

Embodiments of the present disclosure include a method comprising lowering a seed crystal to a melt. The seed crystal is supported by a cable along a lift axis. The cable is supported by a spool of a seed lift assembly. The spool is rotatable about a spool axis. The spool has a spool center of mass positioned along the spool axis. The spool axis intersects the lift axis. The method further comprises simultaneously rotating the seed lift assembly about the lift axis and raising the seed crystal along the lift axis. Raising the seed crystal includes rotating the spool about the spool axis to wind the cable around the spool.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
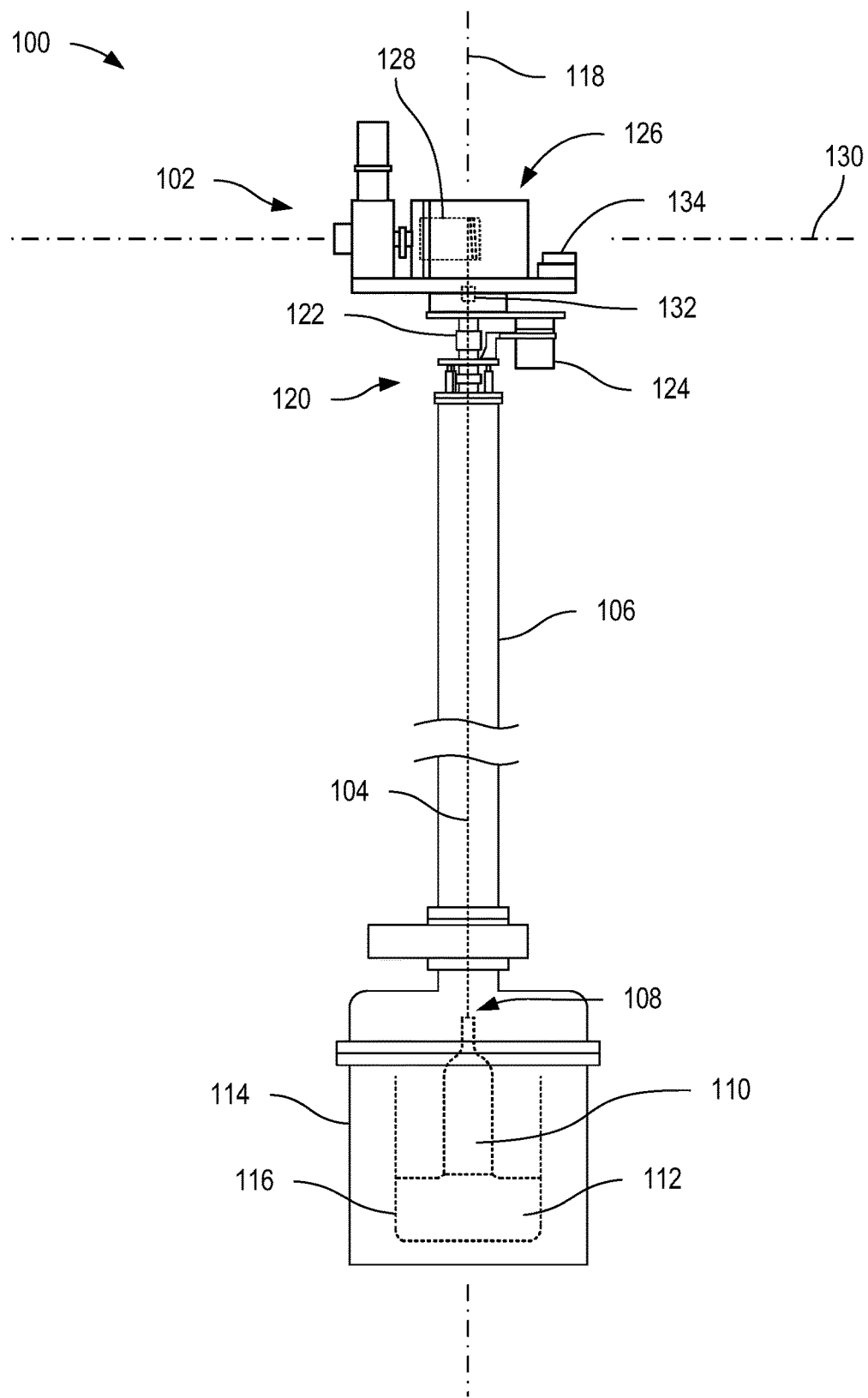
FIG. 1 is a schematic diagram of a crystal growth system with a spool-balanced seed lift assembly, according to certain aspects of the present disclosure.

Certain aspects and features of the present disclosure relate to a crystal growing system that includes a spool-balanced (e.g., unbiased) seed lift assembly for rotating and lifting a seed crystal supported by a cable (e.g., wire rope). The seed crystal is supported along and rotated about a lift axis. The spool-balanced seed lift assembly includes a spool that rotates on, and has a center of gravity along, an axis that intersects the lift axis. As the spool rotates, it moves axially along its axis to avoid displacing the cable from the lift axis. A guide pulley (e.g., cable pulley) positioned below the spool is used to direct the cable between the lift axis and a spool-tangent axis to minimize displacement of the cable as it is raised and rotated.

Certain crystal growth techniques, such as the creation of monocrystalline silicon ingots, makes use of a seed crystal suspended above a melt of material (e.g., metalloids, such as silicon) within a sealed enclosure. The seed crystal is lowered to contact the melt, then raised and rotated in a controlled fashion to permit formation of a nascent ingot of crystallized material (e.g., the growing crystal). As the seed crystal continues to be lifted away from the surface of the melt, the nascent monocrystalline ingot continues to grow until a desired length has been reached. The seed crystal and nascent ingot can be drawn vertically up into a receiving chamber above the melt along a lift axis.

The crystal growing process can take different amounts of times depending on the end size of the ingot. In an example, growing of a cylindrical ingot of monocrystalline silicon to approximately 5-7 meters in length may take approximately two days. Any sufficient disturbances to the system during that time can result in significant defects in the resultant ingot, which may lead to a failed ingot. A failed ingot may need to be re-melted and re-grown, which can be very expensive. Certain aspects of the present disclosure relate to improvements that permit a seed growing system to operate with reduced shaking (e.g., of the cable) and/or other disturbances, while maintaining a small form factor and requiring less static counterbalance.

To achieve desirable and reproducible results with high efficiency, it can be important to provide efficient and precise control of the cable used to suspend, rotate, and raise the seed crystal and nascent ingot. A seed lift assembly positioned at the top of the receiving chamber can control the rotation and lifting of the cable. The cable can exit out from the seed lift assembly at a cable port.

To control rotation, the entire seed lift assembly is rotatably coupled to the receiving chamber so that it can be rotated around an axis of rotation (e.g., seed lift assembly axis of rotation). The axis of rotation of the seed lift assembly is collinear with the lift axis. The seed lift assembly can include a support structure that is rotatably coupled to the top of the receiving chamber, such as via a leveling plate, and driven (e.g., by a rotation motor) to rotate at a desired speed (e.g., on the order of ones or tens of revolutions per minute, such as 1-40 RPM). Components of the seed lift assembly can be mounted to the support structure such that rotation of the support structure effects rotation of all components mounted thereon. In some cases, the support structure can include a base, such as a base plate, to which components may be coupled.

The seed lift assembly can be coupled to the top of the receiving chamber via a leveling plate. The leveling plate can be used to establish a precisely level attachment surface for the seed lift assembly. The leveling plate can be coupled to the top of the receiving chamber via a plurality of leveling adapter posts, which can be individually adjusted to achieve a desired degree of levelness (e.g., achieve a minimum slope of the leveling adapter). For example, a set of three leveling pins may be used in some cases although any number of leveling pins may be used. In some cases, the leveling plate can support a rotation motor that controls rotation of the seed lift assembly.

The mechanisms used to raise the cable are supported by the rotating base of the seed lift assembly, and thus also rotate with respect to the receiving chamber. In some cases, the cable can be lifted by a cable winch system that includes a grooved spool or drum that collects (e.g., winds up) the cable in the groove as the spool is rotated (e.g., rotated at a speed on the order of tenths or ones of revolutions per minute). The cable winch system also axially translates the spool along its axis of rotation (e.g., the spool axis) such that the cable does not overlap itself during the process and so the cable is not axially displaced along the spool axis.

Since the various components of the seed lift assembly have different weights, one or more static and/or non-static counterweights can be coupled to the base of the seed lift assembly at various locations to maintain the center of mass (CoM) of the seed lift assembly at a position aligned with the lift axis, and thus the spool lift assembly axis of rotation. The CoM of the seed lift assembly can be positioned somewhere along this line, such as at a location above the base of the seed lift assembly. As the cable winch moves axially along the spool axis, non-static counterweights (e.g., active counterweights or dynamic counterweights) can be used to offset such axial movement of the spool, including mass added by the cable wound up by the spool.

In traditional implementations, the spool axis of offset from the lift axis (and thus the seed lift assembly axis of rotation), and the cable passes into the seed lift assembly and up to an overhead pulley, which redirects the cable down to the spool. The use of the overhead pulley and offset spool axis facilitate keeping the cable centered along the lift axis as it is being wound up by the spool. However, the offset placement of the spool axis results in the center of mass of the spool being offset from the axis of rotation of the seed lift assembly, thus requiring additional static and/or non-static counterweights to ensure the seed lift assembly's CoM is maintained above the seed lift assembly's axis of rotation, and thus ensure rotation of the seed lift assembly does not cause unwanted displacement of the cable. Also, the use of the overhead pulley requires the entire seed lift assembly to be large and occupy a significant amount of vertical space.

As well, the overhead pulley must include an enclosure to ensure a controlled environment is maintained within the receiving chamber. The enclosure and overhead pulley system can cause increased expenses, provide increased opportunities for failure, and require further static and/or non-static counterbalancing.

According to certain aspects and features of the present disclosure, a spool-balanced seed lift assembly can provide equal or improved seed growing efficacy and/or reduced weight and/or cost as compared to a traditional seed lift assembly. To facilitate description of a spool-balanced seed lift assembly, three perpendicular axes can be named: a lift axis, a spool axis, and a transverse axis. The lift axis can be the axis along which the cable passes within the receiving chamber and about which the seed crystal can rotate. The spool axis can be the axis about which the spool rotates and along which the spool is axially displaced as the cable is raised or lowered. The transverse axis can be the axis that is perpendicular to both the lift axis and the spool axis. For purposes of description, the center of each of the spool axis, lift axis, and transverse axis can be considered to be the point where the spool axis, lift axis, and transverse axis meet.

According to certain aspects of the present disclosure, a spool-balanced seed lift assembly includes a spool having a CoM that lies on the spool axis, which intersects the lift axis, thereby ensuring that the spool's CoM is centered along the transverse axis. Thus, the amount of counterbalancing required for the spool is reduced, since no counterbalancing is needed along the transverse axis. Thus, the overall weight of the spool-balance seed lift assembly can be reduced.

To ensure the cable is not undesirably displaced as it is wrapped around the spool, a guide pulley is located between the spool and the receiving chamber to direct the cable between the lift axis and an axis tangent to the spool. The guide pulley can be supported by one or more force sensors, thus permitting tension in the cable to be accurately measured, such as to determine a weight of the nascent crystal.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

FIG. 1 is a schematic diagram of a crystal growth system 100 with a spool-balanced seed lift assembly 102 and a dynamic counterweight system, according to certain aspects of the present disclosure. The crystal growth system 100 can be used to grow any suitable crystals, such as monocrystalline silicon-based crystals. The crystal growth system 100 can include a furnace tank 114 containing a crucible 116 therein. The furnace tank 114 can provide heat to the crucible 116. The crucible 116 may be initially filled with solid material, which can be heated until it forms a melt 112. The crucible 116 can be controlled to rotate in a first direction.

A receiving chamber 106 can be coupled to the top of the furnace tank 114 via an isolation valve. The receiving chamber 106 can extend for any suitable length. The spool-balanced seed lift assembly 102 can be coupled to the top end of the receiving chamber 106, such as via a leveling adapter 120. The leveling adapter 120 can include a leveling adapter plate coupled to the top end of the leveling adapter 120 by three leveling adapter pins. In some cases, other numbers of leveling adapter pins can be used, such as one, two, or more than three. The leveling adapter pins can be individually adjusted to ensure the leveling adapter plate is level, thus ensuring the spool-balanced seed lift assembly 102 is level.

The spool-balanced seed lift assembly 102 can be rotatably coupled to the leveling adapter 120 via a bearing 122. Thus, the spool-balanced seed lift assembly 102 is rotatably coupled to the receiving chamber 106. A rotation motor 124 can control rotation of the spool-balanced seed lift assembly 102 about the lift axis 118 that passes axially through the center of the receiving chamber 106 (and axially through a centerline of the cable 104 within the receiving chamber 106).

The spool-balanced seed lift assembly 102 can suspend a cable 104 down through the receiving chamber 106 and into the furnace tank 114. At a distal end of the cable 104 (e.g., the end furthest from the spool-balanced seed lift assembly 102) is held a seed crystal 108. The seed crystal can be a small, single crystal of the same material as the melt 112.

The crystal growth system 100 is depicted between the start and end of a growing process. At the beginning of the growing process, the spool-balanced seed lift assembly 102 can lower the cable 104 until the seed crystal 108 contacts the melt 112. The spool-balanced seed lift assembly 102 can then steadily raise the seed crystal 108 (e.g., at a speed on the order of ones, tens, or hundreds of millimeters per hour, such as 0-600 mm/hr) while allowing a nascent ingot 110 to form. To obtain optimal crystal growth, the spool-balanced seed lift assembly 102 can rotate in a direction opposite the direction of rotation of the crucible 116 while simultaneously raising the cable 104. As the cable 104 is raised, the nascent ingot 110 is pulled out of the melt 112, allowing new material to solidify at the bottom of the nascent ingot 110 in alignment with the monocrystalline structure of the nascent ingot 110.

During the growing process, the spool-balanced seed lift assembly 102 will raise the cable 104, and thus the nascent ingot 110, up into the receiving chamber 106 until the growing process ends. The growing process can end when the nascent ingot 110 reaches a desired length, when the material in the crucible 116 is expended, when the spool-balanced seed lift assembly 102 can no longer raise the cable 104 any further, or otherwise.

For illustrative purposes, the spool-balanced seed lift assembly is depicted without a covering or shroud. In some cases, a covering or shroud can surround the spool-balanced seed lift assembly to help maintain the desired environment within the receiving chamber 106 and furnace tank 114. The covering or shroud can keep out dust and contaminants, while permitting the gaseous environment surrounding the nascent ingot 110 to be controlled. In some cases, instead of using a shroud, a controlled environment (e.g., vacuum) can be established within the receiving chamber 106, furnace tank 114, and spool assembly 126.

The spool-balanced seed lift assembly 102 can include one or more counterweights 134 (e.g., static counterweights and/or non-static counterweights) to establish and/or facilitate maintaining the CoM of the spool-balance seed lift assembly 102 over the lift axis 118.

The spool assembly 126 can include a housing that contains a spool 128. The spool 128 is used to wind up or let out the cable 104, thus raising or lowering the cable 104, and thus raising or lowering the seed crystal 108. As described in further detail herein, the spool 128 has a CoM that is positioned along a spool axis 130 that intersects the lift axis 118. As the cable 104 is raised, the spool 128 can move axially along the spool axis 130 without displacing the spool's CoM from the spool axis 130.

The spool assembly 126 can include a guide pulley 132 to direct the cable 104 between the lift axis 118 and the spool 128. For example, as the cable 104 is being lifted, the guide pulley 132 can guide the cable 104 from moving along the lift axis 118 to moving along an axis tangent to the spool 128. The guide pulley 132 can maintain the cable 104 centered along the spool axis 130 (e.g., maintained within a plane that intersects the lift axis 118 and is perpendicular to the spool axis 130). The guide pulley 132 can be positioned below the spool 128, such as between the spool 128 and the receiving chamber 106. More specifically, the guide pulley 132 can be positioned between the spool 128 and the bearing 122, and can be coupled to the base of the spool-balanced seed lift assembly 102, such that the guide pulley 132 rotates about the lift axis 118 along with the other components of the spool-balanced seed lift assembly 102. In some cases, the guide pulley 132 is positioned within or below a base of the spool-balancing seed lift assembly 102.

Figure 2:
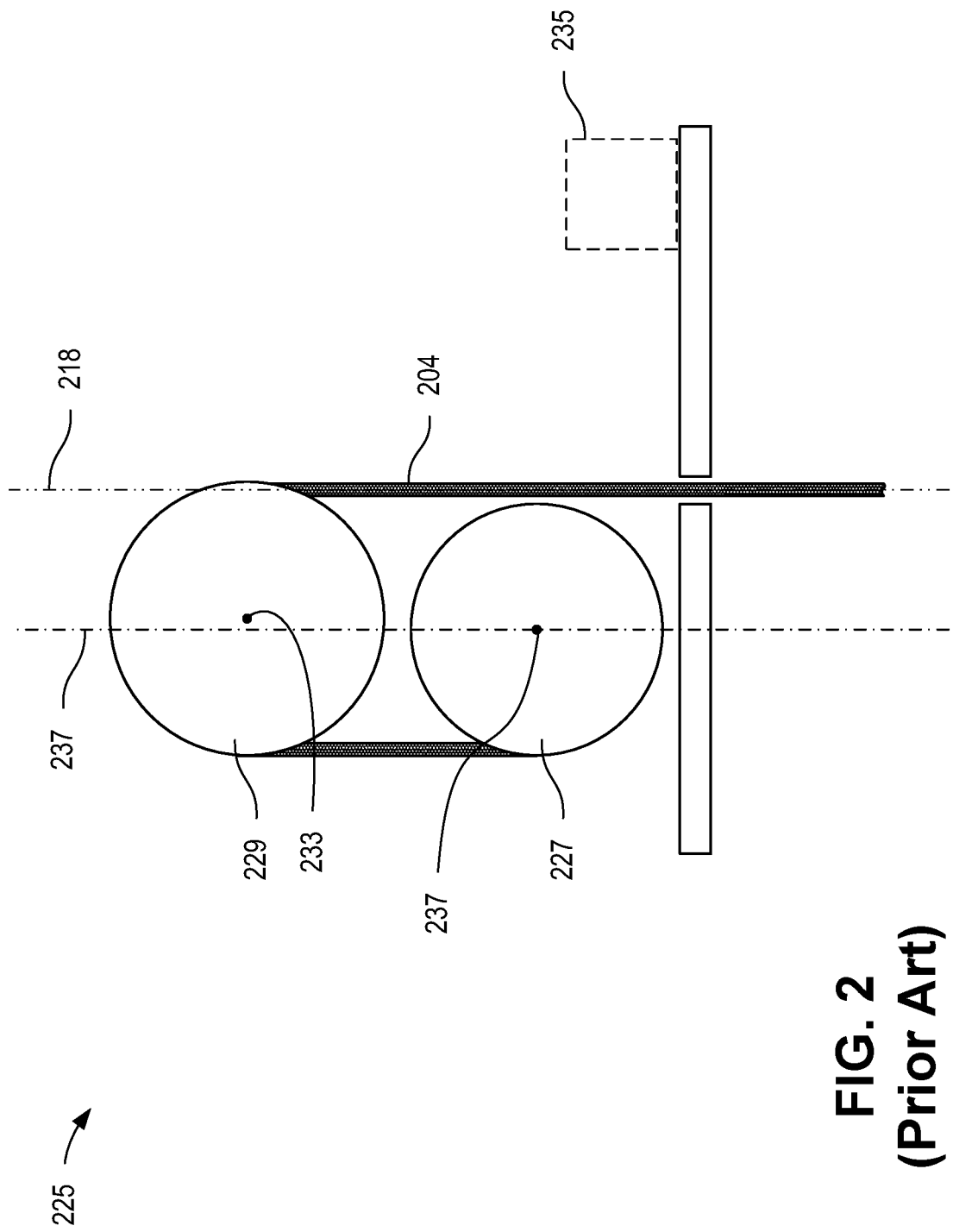
FIG. 2 is a schematic side view of a prior art spool assembly.

FIG. 2 is a schematic side view of a prior art spool assembly 225. The spool assembly 225 can be part of a seed lift assembly designed to rotate and raise a seed crystal during crystal growth. The spool assembly 225 can include a spool 227 for winding up and letting out a cable 204. The spool 227 has a spool center of mass 237 that is offset from a lift axis 218 associated with the cable 204. The spool center of mass 237 can rest in a spool plane 237, which is parallel to and offset from the lift axis 218.

To maintain the cable 204 centered around the lift axis 218, the prior art spool assembly 225 relies on an overhead pulley 229 that receives the cable 204 along the lift axis 218 and redirects the cable 204 towards a groove of the spool 227. Since the spool 227 is offset from the lift axis 218, the diameter of the overhead pulley 229 must be larger than the diameter of the spool 227, such that the overhead pulley 229 can redirect the cable 204 180° from the lift axis 218 towards a groove of the spool 227. Further, the overhead pulley 229 has an overhead pulley center of mass 233 that lies between the spool plane 237 and the lift axis 218.

Because both the spool center of mass 237 and overhead pulley center of mass 233 are offset from the lift axis 218, a counterweight 235 must be used to maintain the center of mass of the entire seed lift assembly aligned with the lift axis 218. In other words, the moment arm created by the masses of the spool 227 and overhead pulley 229 would need to be offset by the moment arm of a counterweight 235 positioned opposite the lift axis 218 from the spool 227 and overhead pulley 229. Thus, the counterweight 235 would either need to be more massive and closer to the lift axis 218, or less massive but located further from the lift axis 218. Thus, overall mass of the prior art seed lift assembly is inversely proportional to the overall size of the prior art seed lift assembly, requiring the improvement of one only at the expense of the other.

Figure 3:
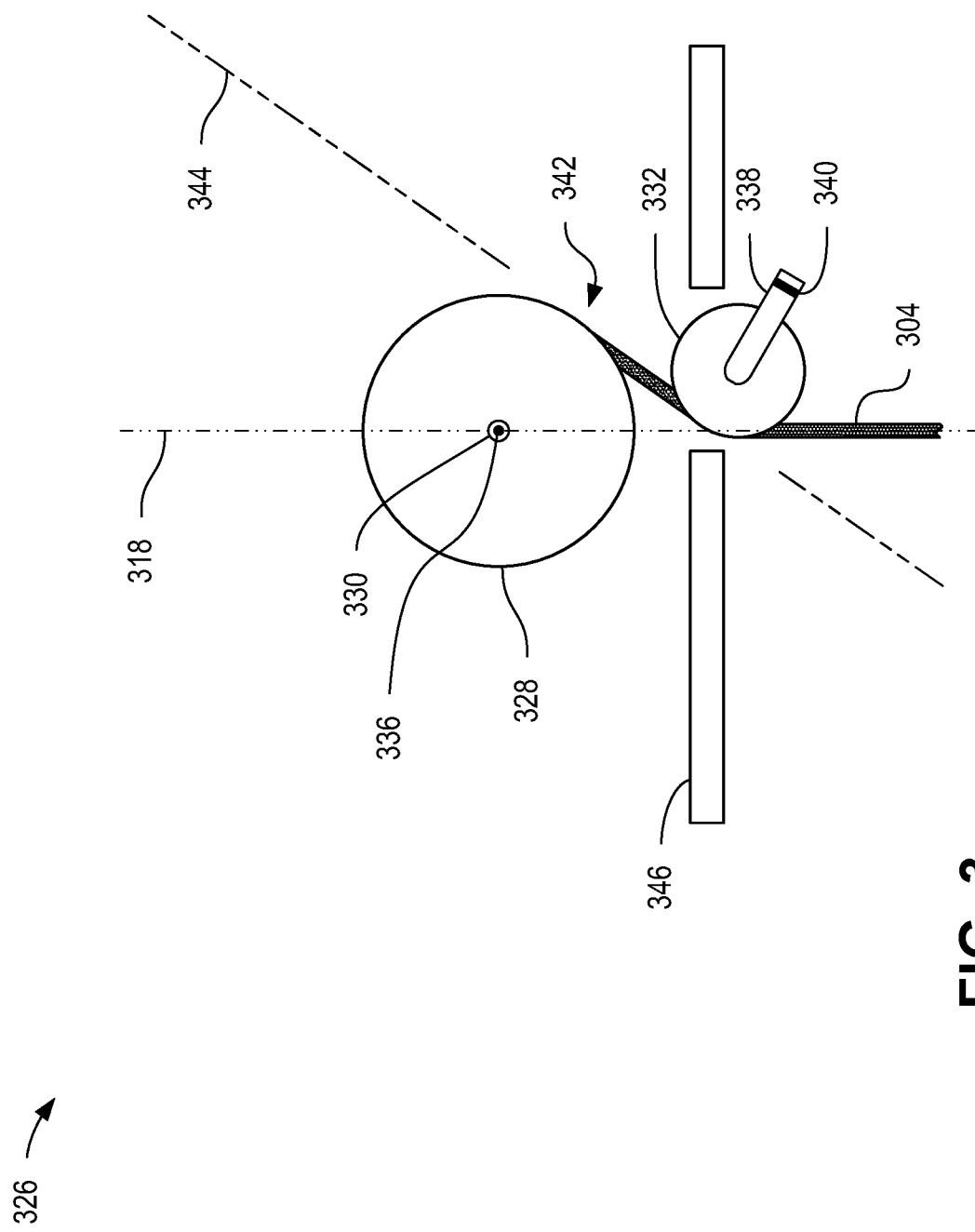
FIG. 3 is a schematic side view of a spool assembly of a spool-balanced seed lift assembly, according to certain aspects of the present disclosure.

FIG. 3 is a schematic side view of a spool assembly 326 of a spool-balanced seed lift assembly, according to certain aspects of the present disclosure. Spool assembly 326 can be any suitable spool assembly, such as spool assembly 126 of FIG. 1.

Spool assembly 326 can include a spool 328 for supporting and receiving a cable 304. A distal end of the cable 304 can support a seed crystal, such as seed crystal 108 of FIG. 1. An opposite, proximal end of the cable 304 can be coupled to the spool 328 such that rotation of the spool 328 causes the cable 304 to be wound onto or unwound from (e.g., let off of) the spool 328. The cable 304 can be supported by the spool assembly 326 such that the distal end of the cable 304, and thus the seed crystal, is suspended along a lift axis 318. For example, rotation of the spool 328 in a direction that causes the cable 304 to be wound onto the spool 328 will cause the seed crystal to move axially in an upward direction along the lift axis 318. Likewise, rotation of the spool 328 in the opposite direction can unwind the cable 304 from the spool 328, thus causing the seed crystal to move axially in a downward direction along the lift axis 318.

In some cases, the spool 328 can include one or more grooves into which the cable 304 may sit. For example, the spool 328 can include a single helical groove for receiving a length of the cable 304 as the cable 304 is wound onto the spool 328.

The spool assembly 326 for a spool-balanced seed lift assembly includes at least one guide pulley 332 to change the direction of the cable 304 so that it can wind onto and unwind from the spool 328 with minimal friction and minimal deviation. The use of the guide pulley 332 allows the central axis of the cable 304 to be maintained along the lift axis 318 when within the receiving chamber or furnace, while allowing the spool 328 to be centrally located (e.g., with the spool axis 330 intersecting the lift axis 318). The guide pulley 332 can take any suitable form, such as an idler pulley with a groove for receiving the cable 304. In some cases, a retaining cover can be used to ensure the cable 304 does not inadvertently jump out of the groove of the guide pulley 332. In some cases, the guide pulley 332 can take a different form, such as a low-friction cable guide (e.g., a toroidal ring made of a low-friction material) or a series of bearings around a ring.

To ensure the seed lift assembly remains spool-balanced, the spool 328 can be positioned such that its spool axis 330 intersects the lift axis 318. The spool axis 330 can intersect the lift axis 318 perpendicularly. The spool's center of mass can be positioned along the spool axis 330.

In some cases, a single guide pulley 332 is used, although that need not always be the case. In some cases, multiple guide pulleys can be used, as described in further detail herein. The guide pulley 332 can be positioned below the spool 328, such as at a location between the spool 328 and the receiving chamber. In some cases, such as depicted in FIG. 3, the guide pulley 332 can extend through the base 346, although in other cases the guide pulley 332 can be positioned above or below the base 346.

The guide pulley 332 can be of any suitable diameter. In some cases, the diameter of the guide pulley 332 is smaller than the spool 328. In some cases, the diameter of the guide pulley 332 is set based on the diameter of the cable 304 and/or a minimum bending radius of the cable 304. The minimum bending radius of the cable 304 can be predetermined for the cable, such as being accessed from the cable's specifications or being calculated based on the cable's diameter. When a single guide pulley 332 is used, the guide pulley 332 should be sized and/or positioned such that the cable 304 does not undergo any bending that is lower than the minimum bending radius of the cable 304. In some cases, the guide pulley 332 can have a radius that is smaller than the minimum bending radius of the cable 304. In some cases, multiple guide pulleys can be used to achieve a direction change that would otherwise require using a bending radius that is smaller than the minimum bending radius of the cable 304 if only a single guide pulley were used. In such cases, each guide pulley can bend the cable 304 along a radius that is greater than the minimum bending radius of the cable 304 until the desired direction change is achieved. Thus, when multiple guide pulleys are used, each guide pulley individually effects a change to the axial direction of the cable 304 along a radius that is greater than the minimum cable bending radius of the cable 304.

In some cases, the use of multiple guide pulleys can serve the same or a similar function as a single guide pulley 332, such as a sufficiently large bending radius, while adding less mass to the spool assembly 326 and/or while achieving a more compact structure.

The guide pulley 332 can act to shift the axial direction of the cable 304 (e.g., the direction the central axis of the cable is pointing) between collinear with the lift axis 318 and a second direction collinear with axis 344. Axis 344 is an axis that is tangent to the spool 328 (e.g., a cable-supporting surface of the spool 328, such as a cable-supporting surface within a groove of the spool 328) at a transient location 342 on the spool 328. The transient location 342 is a location on the spool 328 as which the cable 304 transitions between contacting the spool 328 and not contacting the spool 328. In some cases, the shift of the axial direction of the cable 304 by the guide pulley 332 is accomplished by a single pulley, although in some cases additional guide pulleys can be used.

The guide pulley 332 can be supported by a support 338 that is coupled to the supporting structure of the spool-balanced seed lift assembly (e.g., coupled to the base 346 of the spool-balanced seed lift assembly). The guide pulley 332 can thus rotate around the lift axis 318 along with the other components of the spool-balanced seed lift assembly. Any suitable support 338 can be used, such as a bracket or yolk. The guide pulley 332 can rotate about an axis of rotation that is parallel to the spool axis 330.

In some cases, one or more a force sensors 340 can be coupled to the guide pulley 332 (e.g., via the support 338) to measure force applied from the cable 304 against the guide pulley 332. Measurement of this force can be used to derive information about the status of the crystal growing process, such as the current weight of the nascent ingot. The measured force can have a vertical component (e.g., a component parallel to the lift axis 318) and a horizontal component (e.g., a component perpendicular to the vertical component, such as to the right as depicted in FIG. 3). In some cases, the measured force, or more specifically the horizontal component of the measured force, can be adjusted to compensate for any apparent centrifugal force resulting from the guide pulley 332 rotating about the lift axis 318. Such an offset can be based on a static constant or can be dynamically adjusted based on the speed of rotation of the seed lift assembly. In such cases, one or more sensors of the seed lift assembly can be used to determine the speed of rotation of the seed lift assembly.

As used herein, reference to a spool 328 having a spool axis 330 that intersects the lift axis 318 to effect a spool-balanced seed lift assembly can mean that the spool axis 330 precisely intersects the lift axis 318 or substantially intersects the lift axis 318. Substantially intersecting the lift axis 318 can include deviating from the lift axis 318 by 0.5%, 1%, 1.5%, 2%, 2.5%, 3%, 3.5%, 4%, 4.5%, 5%, 6.5%, 7%, 7.5%, 8%, 8.5%, 9%, 9.5%, or 10% of the diameter of the spool 328. In some cases, a spool axis 330 that substantially intersects the lift axis 318 may be offset from the lift axis 318 in a direction opposite the guide pulley 332 (e.g., towards the left of the lift axis 318 as depicted in FIG. 3), such that the mass of the guide pulley 332 (and optionally related components) is naturally offset by the mass of the spool 328 (and optionally related components). Thus, the center of mass of the entire spool assembly may be located along an axis perpendicular to and intersecting the lift axis 318.

Figure 4:
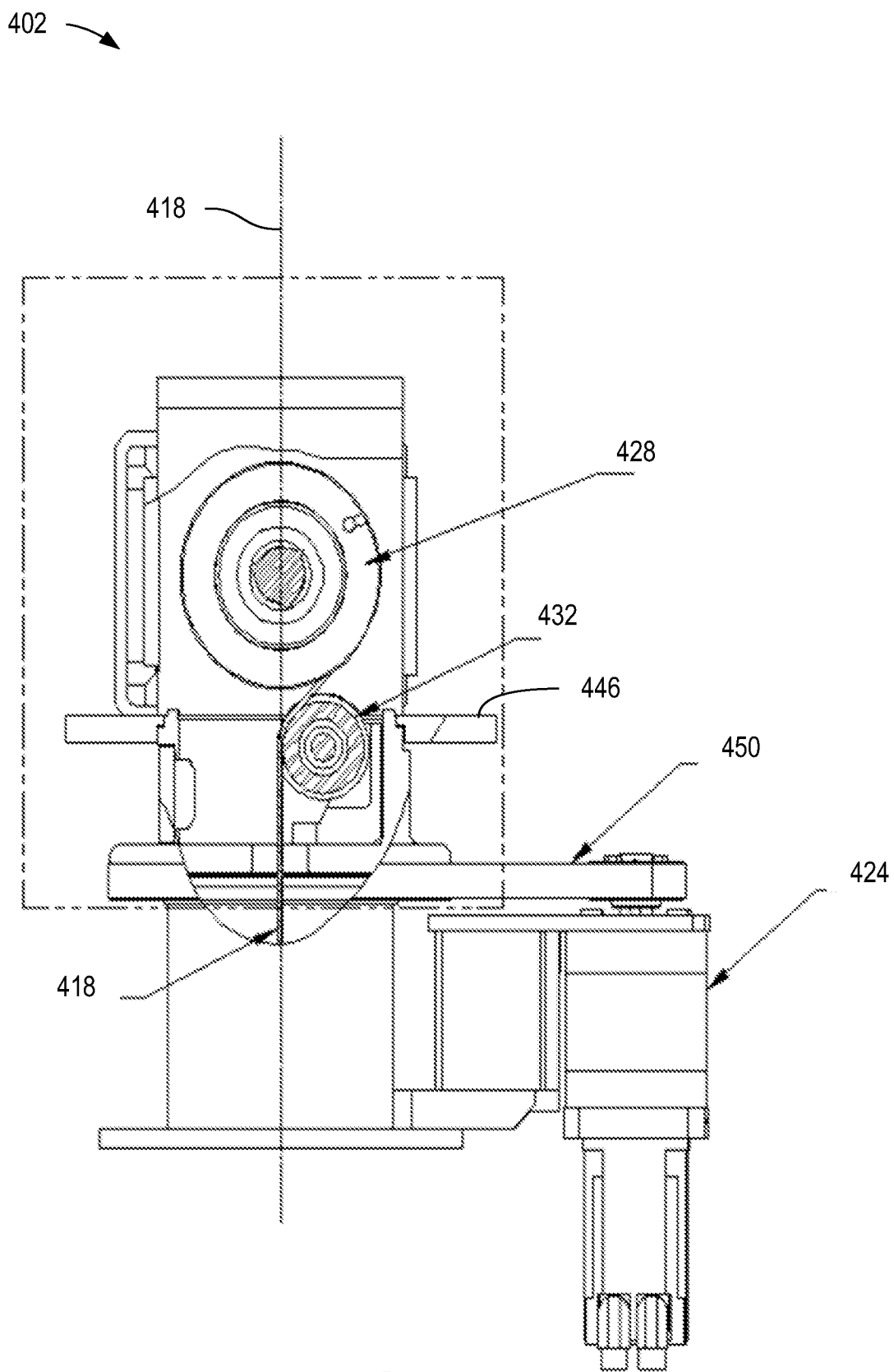
FIG. 4 is a partial-cutaway side view of a portion of a spool-balanced seed lift assembly, according to certain aspects of the present disclosure.

FIG. 4 is a partial-cutaway side view of a portion of a spool-balanced seed lift assembly 402, according to certain aspects of the present disclosure. The spool-balanced seed lift assembly 402 can be any suitable spool-balanced seed lift assembly, such as spool-balanced seed lift assembly 102 of FIG. 1.

As depicted in FIG. 4, the spool-balanced seed lift assembly 402 can include a spool 428 and guide pulley 432 supported on a base 446. In this side view, the spool 428 is centered along the lift axis 418, thus placing the axis of rotation of the spool 428 (e.g., spool axis) as intersecting the lift axis 418. A cable 418 can pass up into the spool-balanced seed lift assembly 402 from below, where the cable 418 is collinear with the lift axis 418, at which point the cable can pass over the guide pulley 432 to be redirected towards a circumference of the spool 428 before being wound around the spool 428.

The spool-balanced seed lift assembly 402 can be driven to rotate about the lift axis 418 by a rotation driver 424 (e.g., rotation motor) and drive belt 450. For example, the rotation driver 424 can be held fixed with respect to the receiving chamber and can be coupled to the base 446 (or other support) of the spool-balanced seed lift assembly 402 via the drive belt 450, such that rotation of the spool-balanced seed lift assembly 402 with respect to the receiving chamber can be effected by driving the rotation driver 424.

Figure 5:
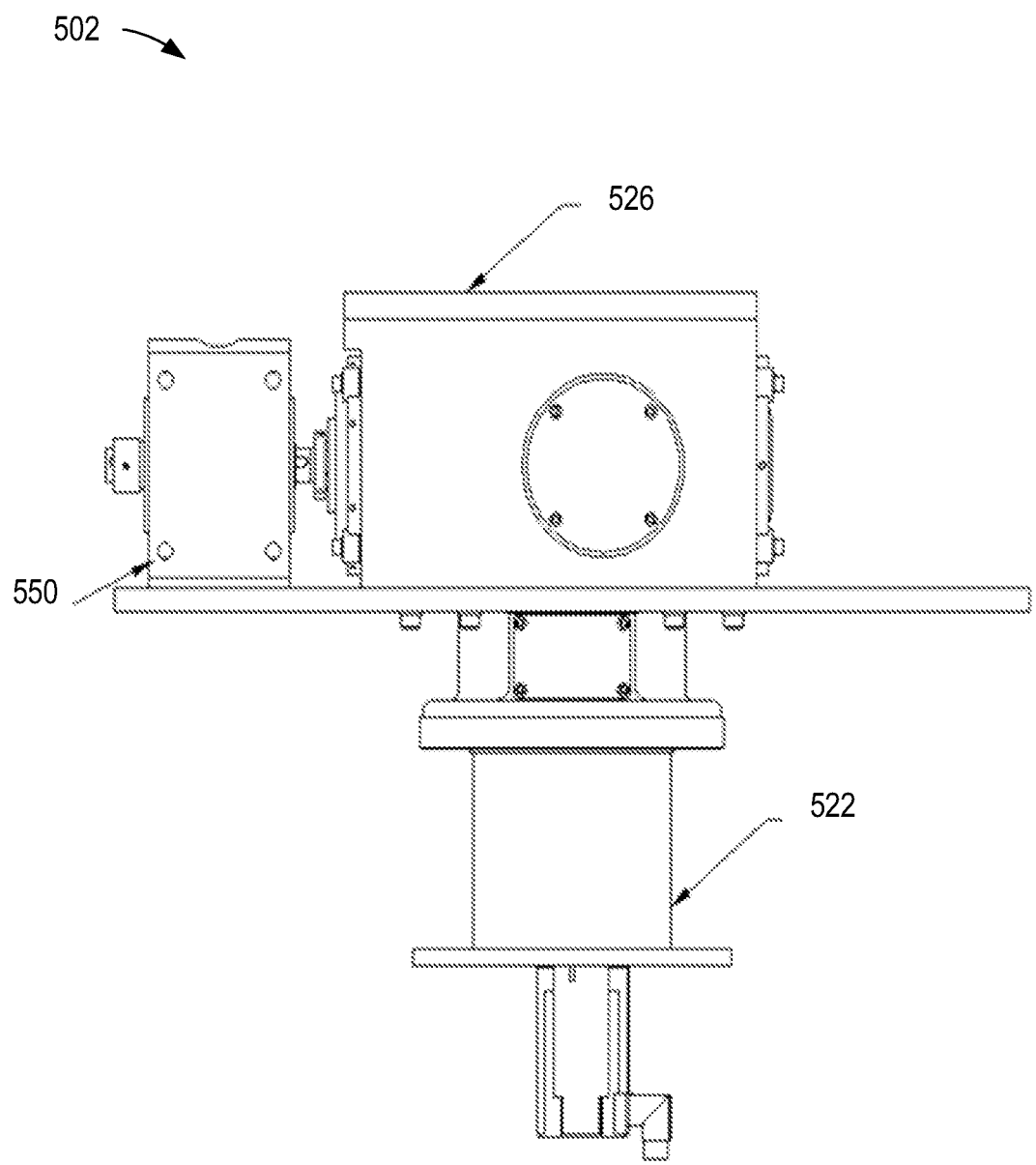
FIG. 5 is a front view of a portion of a spool-balanced seed lift assembly, according to certain aspects of the present disclosure.

FIG. 5 is a front view of a portion of a spool-balanced seed lift assembly 502, according to certain aspects of the present disclosure. The spool-balanced seed lift assembly 502 can be any suitable spool-balanced seed lift assembly, such as spool-balanced seed lift assembly 402 of FIG. 4.

The spool-balanced seed lift assembly 502 can couple to the receiving chamber via a bearing 552, thus permitting the spool-balanced seed lift assembly 502 to rotate with respect to the receiving chamber about the lift axis.

The spool within the spool assembly 526 can be driven by a spool driver 550. The spool driver 550 can include a motive source (e.g., a motor) and related equipment (e.g., a gearbox). In some cases, the spool driver 550 is a reducing motor. In some cases, the spool driver 550 can have a center of mass that rests in a plane defined by the spool axis and the lift axis. Thus, like the spool itself, the spool driver 550 can be balanced.

Figure 6:
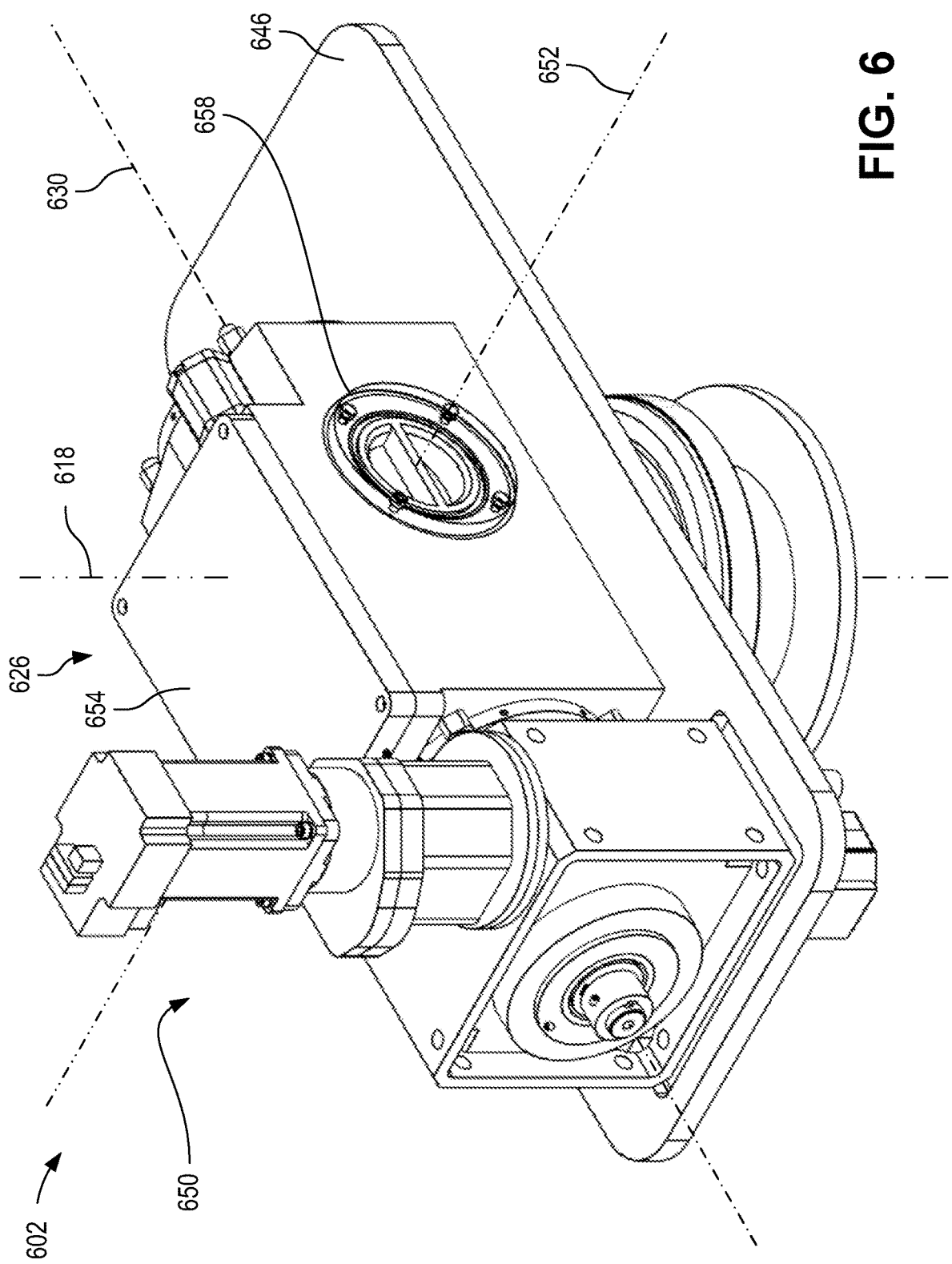
FIG. 6 is an isometric view of a spool-balanced seed lift assembly, according to certain aspects of the present disclosure.

FIG. 6 is an isometric view of a spool-balanced seed lift assembly 602, according to certain aspects of the present disclosure. The spool-balanced seed lift assembly 602 can be any suitable spool-balanced seed lift assembly, such as spool-balanced seed lift assembly 102 of FIG. 1.

The spool-balanced seed lift assembly 602 can include a support structure 646 (e.g., a base) supporting a spool driver 650 and a spool assembly 626, which contains a spool and guide pulley. As seen in FIG. 6, a housing 654 surrounds the spool assembly 626, thus facilitating establishing a controlled environment within the receiving tube and furnace tank.

The spool-balance seed lift assembly 602 supports a cable along a lift axis 618. The spool within the spool assembly 626 rotates about a spool axis 630. The spool axis 630 intersects with and is perpendicular to the lift axis 618. A transverse axis 652 can be defined as the axis that intersects with and is perpendicular to both the spool axis 630 and lift axis 618. The spool can be described as being centered along the transverse axis 652, or transversely centered.

In some cases, a window 658 can be placed to permit visual access and/or physical access to the spool and/or other internals of the spool assembly 626. The window 658 can be an inspection window, having a transparent or substantially transparent covering in place; or can be an access window (e.g., an opening), having no covering in place. An inspection window can provide visual access to internals of the spool assembly 626, while an access window can provide physical access. An access window can be covered with a removable covering, such as depicted in FIG. 6.

Figure 7:
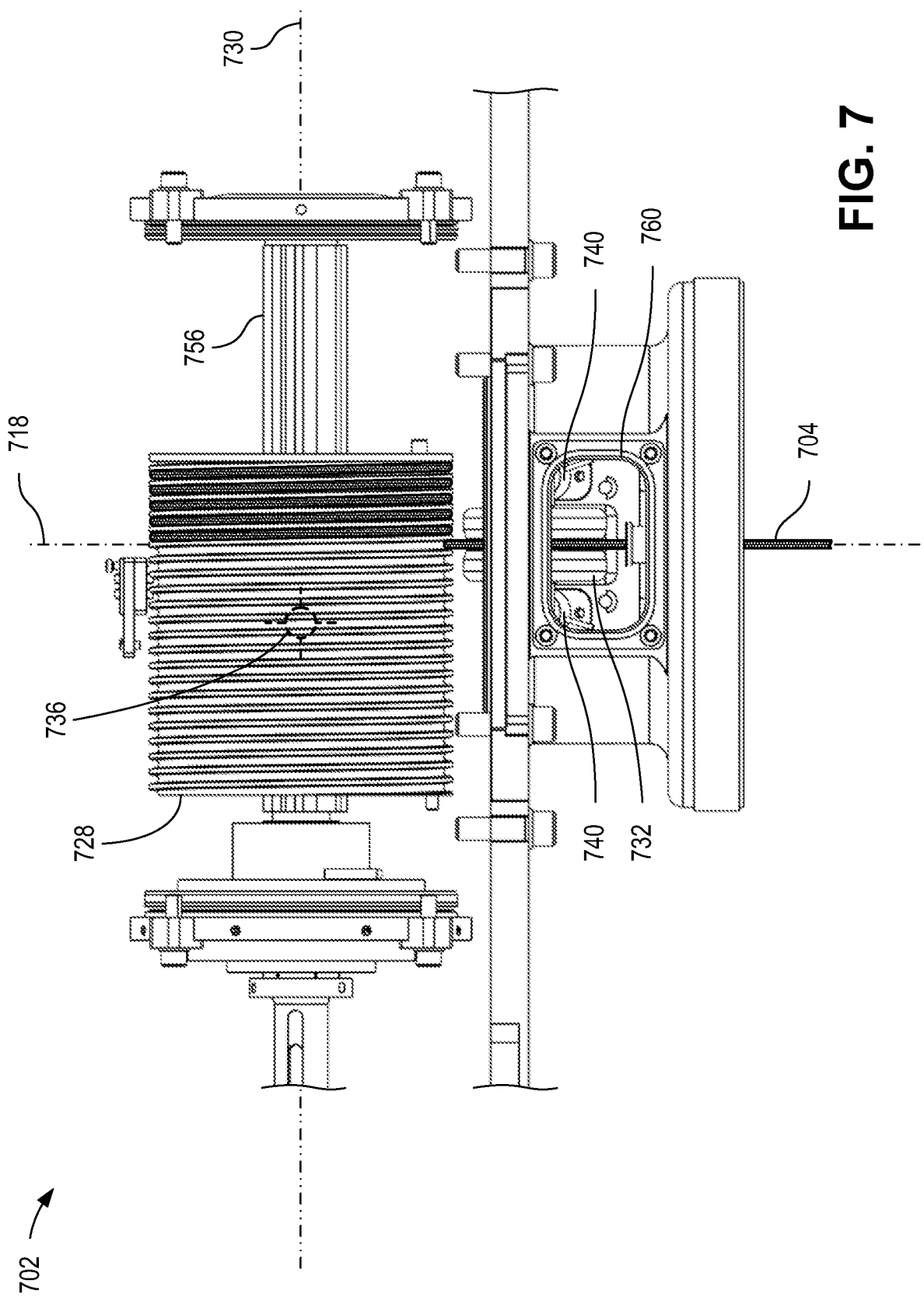
FIG. 7 is a front view of a spool-balanced seed lift assembly, according to certain aspects of the present disclosure.

FIG. 7 is a partial front view of a spool-balanced seed lift assembly 702, according to certain aspects of the present disclosure. The spool-balanced seed lift assembly 702 can be any suitable spool-balanced seed lift assembly, such as spool-balanced seed lift assembly 102 of FIG. 1. For illustrative purposes, certain components of the spool-balanced seed lift assembly 702 are not depicted.

The spool-balanced seed lift assembly 702 can support a cable 704 along a lift axis 718. The cable 704 can enter the spool-balanced seed lift assembly 702 from the bottom and pass over a guide pulley 732. The guide pulley 732 can be mechanically coupled to a pair of force sensors 740 via an axle, permitting the amount of force applied to the guide pulley 732 by the cable 704 to be measured. After passing over the guide pulley 732, the cable 704 can be directed into a helical groove of a spool 728.

The spool 728 can be supported by a shaft 756 (e.g., a spline shaft) such that the spool 728 is rotatable about an axis of rotation known as the spool axis 730. The shaft 756 can be driven by a spool driver (e.g., spool driver 650 of FIG. 6). The spool axis 730 intersects the lift axis 718. The spool 728 has a spool center of mass 736 that falls along the spool axis 730, and thus falls in a plane formed by the spool axis 730 and the lift axis 718.

As the spool 728 rotates, it moves axially along the spool axis 730, thus always maintaining the transition point aligned with the lift axis 718 and groove. For example, continued winding of the cable 704 onto the spool 728 would result in the spool 728 being axially displaced in a direction towards the right, as depicted in FIG. 7. As the spool 728 is axially displaced, the spool's center of mass 736 is also axially displaced, but remains on the spool axis 730. In some cases, the spool's center of mass 736 may meet and/or cross the lift axis 718. Thus, in some cases, such as during a crystal growing procedure, a spool-balance seed lift assembly 702 can have a spool 728 positioned such that the spool's center of mass 736 overlaps the lift axis 718. In such cases, continued rotation of the spool 728 (e.g., in one direction or an opposite direction) can cause the spool's center of mass 736 to move away from overlapping the lift axis 718.

In some cases, a window 760 can be placed to permit visual access and/or physical access to the guide pulley 732 and surrounding space. The window 760 can be an inspection window, having a transparent or substantially transparent covering in place; or can be an access window (e.g., an opening), having no covering in place. An inspection window can provide visual access to the guide pulley 732 and surrounding space, while an access window can provide physical access. An access window can be covered with a removably covering.

Figure 8:
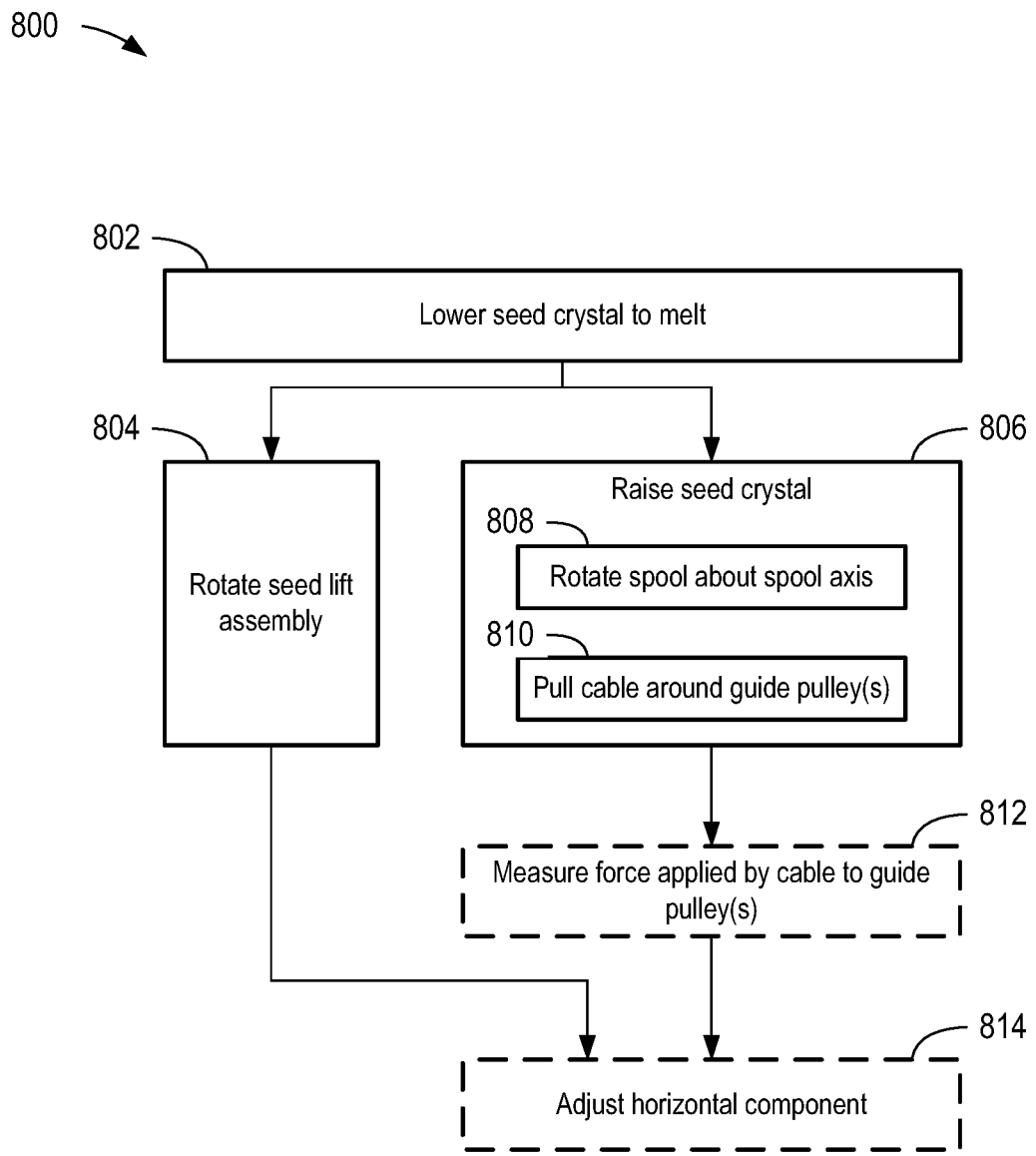
FIG. 8 is a flowchart depicting a process for using a spool-balanced seed lift assembly, according to certain aspects of the present disclosure.

FIG. 8 is a flowchart depicting a process 800 for using a spool-balanced seed lift assembly, according to certain aspects of the present disclosure. Process 800 can be used with any suitable spool-balanced seed lift assembly, such as spool-balanced seed lift assembly 102 of FIG. 1.

At block 802, a seed crystal is lowered to a melt. The seed crystal can be supported by a cable that is in turn supported by a spool of a spool-balanced seed lift assembly. Lowering the seed crystal to the melt can include rotating the spool in a first direction to unwind the cable from the spool, thus lowering the seed crystal along a lift axis until the seed crystal contacts the melt.

After block 802, a nascent crystal can be grown by simultaneously rotating the seed lift assembly at block 804 and raising the seed crystal at block 806. This combined rotation and raising action result in the seed crystal being rotated while being lifted away from the melt. In some cases, the melt can be further rotated in a direction opposite to the rotation of the seed crystal. Rotation of the seed lift assembly at block 804 can include driving a rotation driver to rotate the seed lift assembly about the lift axis.

Raising the seed crystal at block 806 can include rotating the spool about the spool axis at block 808. Rotating the spool about the spool axis (e.g., in a second direction that is opposite the first direction from block 802) can cause the cable to be wound onto the spool. Additionally, rotating the spool at block 808 can automatically cause the cable to be pulled around one or more guide pulleys at block 810, thus altering the axial direction of the cable between a direction collinear with the lift axis and a second direction (e.g., a direction tangent to the spool at a transition point where the cable transitions between contacting the spool and not contacting the spool). In some cases, a single guide pulley can be used.

The use of the guide pulley can permit the center of mass of the spool to remain balanced (e.g., aligned with the spool axis that intersects the lift axis). In some cases, rotation of the spool at block 808 includes axially displacing the spool along the spool axis until the center of mass of the spool overlaps the lift axis. In some cases, rotation of the spool at block 808 includes axially displacing the spool along the spool axis so that the center of mass of the spool is moved away from overlapping the lift axis. In some cases, rotation of the spool at block 808 includes axially displacing the spool such that the center of mass of the spool is moved along a radius extending from the lift axis (e.g., radially displacing the center of mass of the spool with respect to the lift axis).

In some optional cases, force applied by the cable to the guide pulley(s) can be measured at block 812. Measurement of such forces can include receiving sensor data from one or more force sensors associated with one or more of the guide pulley(s). In some optional cases, a horizontal component of the measured force can be adjusted at block 814. Adjusting the horizontal component of the measured force can include offsetting apparent centrifugal force sensed by the one or more force sensors as a result of rotating the seed lift assembly at block 804. In some cases, adjusting the horizontal component can include applying a static calculation to the measured force. In some cases, adjusting the horizontal component can include determining a speed of rotation of the seed lift assembly (e.g., via a rotation sensor or based on the rotation driver), then using that speed of rotation to calculate an adjustment to the horizontal component. For example, as the speed of rotation increases, the amount of adjustment may increase proportionally.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the disclosure. Thus, the breadth and scope of the present disclosure should not be limited by any of the above described embodiments.

Although certain aspects and features of the present disclosure have been illustrated and described with respect to one or more implementations, equivalent alterations and modifications will occur or be known to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

As used below, any reference to a series of examples is to be understood as a reference to each of those examples disjunctively (e.g., "Examples 1-4" is to be understood as "Examples 1, 2, 3, or 4").

Example 1 is a seed lift assembly for a crystal growing system, the seed lift assembly comprising: a support structure rotatable about a lift axis; a spool for receiving a cable supporting a seed crystal along the lift axis, the spool being rotatable about a spool axis, the spool having a spool center of mass positioned along the spool axis, wherein the spool is coupled to the support structure such that the spool axis intersects the lift axis; a spool driver coupled to the spool to effect rotation of the spool about the spool axis, wherein rotation of the spool about the spool axis controls winding of the cable about the spool to control vertical displacement of the seed crystal along the lift axis; and a guide pulley coupled to the support structure to change an axial direction of the cable between a first direction collinear with the lift axis and a second direction.

Example 2 is the seed lift assembly of example(s) 1, wherein the second direction is tangent to a groove of the spool at a transition location, wherein the cable transitions between contacting the spool and not contacting the spool at the transition location.

Example 3 is the seed lift assembly of example(s) 1 or 2, further comprising one or more additional guide pulleys coupled to the support structure to change the axial direction of the cable between the second direction and a third direction.

Example 4 is the seed lift assembly of example(s) 3, wherein the cable has a minimum cable bending radius, and wherein each of the guide pulley and the one or more additional guide pulleys individually effects a change to the axial direction of the cable along a radius that is greater than the minimum cable bending radius.

Example 5 is the seed lift assembly of example(s) 1-4, wherein the guide pulley rotates about a guide pulley axis that is parallel to the spool axis.

Example 6 is the seed lift assembly of example(s) 1-5, further comprising a force sensor coupled between the guide pulley and the support structure to measure force applied to the guide pulley by the cable.

Example 7 is the seed lift assembly of example(s) 1-6, wherein the spool driver has a driver center of mass that lies in a plane formed by the spool axis and the lift axis.

Example 8 is the seed lift assembly of example(s) 1-7, wherein the guide pulley is positioned at a location between the spool and the seed crystal.

Example 9 is a crystal growing system, comprising: a furnace tank having a crucible for containing a melt; a receiving chamber coupled to the furnace tank; a seed crystal suspended within the receiving chamber by a cable along a lift axis; a seed lift assembly rotatably coupled to the receiving chamber to rotate about the lift axis, the seed lift assembly including: a support structure; a spool for receiving the cable, the spool being rotatable about a spool axis, the spool having a spool center of mass positioned along the spool axis, wherein the spool is coupled to the support structure such that the spool axis intersects the lift axis; a spool driver coupled to the spool to effect rotation of the spool about the spool axis, wherein rotation of the spool about the spool axis controls winding of the cable about the spool to control vertical displacement of the seed crystal along the lift axis; and a guide pulley coupled to the support structure to change an axial direction of the cable between a first direction collinear with the lift axis and a second direction.

Example 10 is the crystal growing system of example(s) 9, wherein the second direction is tangent to a groove of the spool at a transition location, wherein the cable transitions between contacting the spool and not contacting the spool at the transition location.

Example 11 is the crystal growing system of example(s) 9 or 10, wherein the seed lift assembly further comprises one or more additional guide pulleys coupled to the support structure to change the axial direction of the cable between the second direction and a third direction.

Example 12 is the crystal growing system of example(s) 11, wherein the cable has a minimum cable bending radius, and wherein each of the guide pulley and the one or more additional guide pulleys individually effects a change to the axial direction of the cable along a radius that is greater than the minimum cable bending radius.

Example 13 is the crystal growing system of example(s) 9-12, wherein the guide pulley rotates about a guide pulley axis that is parallel to the spool axis.

Example 14 is the crystal growing system of example(s) 9-13, wherein the seed lift assembly further comprises a force sensor coupled between the guide pulley and the support structure to measure force applied to the guide pulley by the cable.

Example 15 is the crystal growing system of example(s) 9-14, wherein the spool driver has a driver center of mass that lies in a plane formed by the spool axis and the lift axis.

Example 16 is the crystal growing system of example(s) 9-15, wherein the guide pulley is positioned at a location between the spool and the seed crystal.

Example 17 is a method, comprising: lowering a seed crystal to a melt, the seed crystal being supported by a cable along a lift axis, the cable being supported by a spool of a seed lift assembly, the spool being rotatable about a spool axis, the spool having a spool center of mass positioned along the spool axis, wherein the spool axis intersects the lift axis; simultaneously rotating the seed lift assembly about the lift axis and raising the seed crystal along the lift axis, wherein raising the seed crystal includes rotating the spool about the spool axis to wind the cable around the spool.

Example 18 is the method of example(s) 17, wherein raising the seed crystal further includes pulling the cable past one or more guide pulleys in response to winding the cable around the spool, wherein pulling the cable past the one or more guide pulleys induces the cable to change its axial direction between a first direction that is collinear with the lift axis and a second direction that is tangent to a groove of the spool at a transition location, wherein the cable transitions between contacting the spool and not contacting the spool at the transition location.

Example 19 is the method of example(s) 18, wherein the cable has a minimum cable bending radius, and wherein each of the one or more guide pulleys individually effects a change to the axial direction of the cable along a radius that is greater than the minimum cable bending radius.

Example 20 is the method of example(s) 17-19, further comprising measuring a force applied by the cable to the one or more guide pulleys using at least one force sensor coupled to the one or more guide pulleys.

What is claimed is:

1. A seed lift assembly for a crystal growing system, the seed lift assembly comprising:
    a support structure rotatable about a lift axis;
    a spool for receiving a cable supporting a seed crystal along the lift axis, the spool being rotatable about a spool axis, the spool having a spool center of mass positioned along the spool axis, wherein the spool is coupled to the support structure such that the spool axis intersects the lift axis;
    a spool driver coupled to the spool to effect rotation of the spool about the spool axis, wherein rotation of the spool about the spool axis controls winding of the cable about the spool to control vertical displacement of the seed crystal along the lift axis; and
    a guide pulley coupled to the support structure to change an axial direction of the cable between a first direction collinear with the lift axis and a second direction, the guide pulley being in direct contact with the cable to guide the cable along the lift axis, the guide pulley being rotatable about a guide pulley axis that is parallel to the spool axis.

2. The seed lift assembly of claim 1, wherein the second direction is tangent to a groove of the spool at a transition location, wherein the cable transitions between contacting the spool and not contacting the spool at the transition location.

3. The seed lift assembly of claim 1, further comprising one or more additional guide pulleys coupled to the support structure to change the axial direction of the cable between the second direction and a third direction.

4. The seed lift assembly of claim 3, wherein the cable has a minimum cable bending radius, and wherein each of the guide pulley and the one or more additional guide pulleys individually effects a change to the axial direction of the cable along a radius that is greater than the minimum cable bending radius.

5. The seed lift assembly of claim 1, further comprising a force sensor coupled between the guide pulley and the support structure to measure force applied to the guide pulley by the cable.

6. The seed lift assembly of claim 1, wherein the spool driver has a driver center of mass that lies in a plane formed by the spool axis and the lift axis.

7. The seed lift assembly of claim 1, wherein the guide pulley is positioned at a location between the spool and the seed crystal.

8. The seed lift assembly of claim 1, wherein the guide pulley is in direct contact with the cable along the lift axis at a first point, the cable being in direct contact with a surface of the spool at a second point, the second direction being angled relative to the first direction and being defined by the first and second points.

9. A crystal growing system, comprising:
    a furnace tank having a crucible for containing a melt;
    a receiving chamber coupled to the furnace tank;
    a seed crystal suspended within the receiving chamber by a cable along a lift axis;
    a seed lift assembly rotatably coupled to the receiving chamber to rotate about the lift axis, the seed lift assembly including:
        a support structure;
        a spool for receiving the cable, the spool being rotatable about a spool axis, the spool having a spool center of mass positioned along the spool axis, wherein the spool is coupled to the support structure such that the spool axis intersects the lift axis;
        a spool driver coupled to the spool to effect rotation of the spool about the spool axis, wherein rotation of the spool about the spool axis controls winding of the cable about the spool to control vertical displacement of the seed crystal along the lift axis; and
        a guide pulley coupled to the support structure to change an axial direction of the cable between a first direction collinear with the lift axis and a second direction, the guide pulley being in direct contact with the cable to guide the cable along the lift axis, the guide pulley being rotatable about a guide pulley axis that is parallel to the spool axis.

10. The crystal growing system of claim 9, wherein the second direction is tangent to a groove of the spool at a transition location, wherein the cable transitions between contacting the spool and not contacting the spool at the transition location.

11. The crystal growing system of claim 9, wherein the seed lift assembly further comprises one or more additional guide pulleys coupled to the support structure to change the axial direction of the cable between the second direction and a third direction.

12. The crystal growing system of claim 11, wherein the cable has a minimum cable bending radius, and wherein each of the guide pulley and the one or more additional guide pulleys individually effects a change to the axial direction of the cable along a radius that is greater than the minimum cable bending radius.

13. The crystal growing system of claim 9, wherein the seed lift assembly further comprises a force sensor coupled between the guide pulley and the support structure to measure force applied to the guide pulley by the cable.

14. The crystal growing system of claim 9, wherein the spool driver has a driver center of mass that lies in a plane formed by the spool axis and the lift axis.

15. The crystal growing system of claim 9, wherein the guide pulley is positioned at a location between the spool and the seed crystal.

16. The crystal growing system of claim 9, wherein the guide pulley is in direct contact with the cable along the lift axis at a first point, the cable being in direct contact with a surface of the spool at a second point, the second direction being angled relative to the first direction and being defined by the first and second points.

* * * * *